United States Patent
Ishimaru et al.

(10) Patent No.: US 7,286,401 B2
(45) Date of Patent: Oct. 23, 2007

(54) NONVOLATILE SEMICONDUCTOR MEMORY DEVICE

(75) Inventors: Tetsuya Ishimaru, Tokyo (JP); Takanori Yamazoe, Hadano (JP)

(73) Assignee: Renesas Technology Corp., Tokyo (JP)

( * ) Notice: Subject to any disclaimer, the term of this patent is extended or adjusted under 35 U.S.C. 154(b) by 200 days.

(21) Appl. No.: 11/002,794

(22) Filed: Dec. 3, 2004

(65) Prior Publication Data
US 2005/0135155 A1  Jun. 23, 2005

(30) Foreign Application Priority Data
Dec. 19, 2003 (JP) .............................. 2003-422119

(51) Int. Cl.
*G11C 16/04* (2006.01)
*G11C 14/00* (2006.01)
*G11C 7/00* (2006.01)
*G11C 8/00* (2006.01)

(52) U.S. Cl. .......................... 365/185.11; 365/185.08; 365/222; 365/230.03; 365/230.08; 365/236

(58) Field of Classification Search ........... 365/185.02, 365/185.08, 185.11, 222, 236, 230.03
See application file for complete search history.

(56) References Cited

U.S. PATENT DOCUMENTS

| | | | |
|---|---|---|---|
| 5,969,383 A | 10/1999 | Change et al. ............... | 257/316 |
| 6,005,810 A * | 12/1999 | Wu ........................ | 365/185.33 |
| 6,160,738 A | 12/2000 | Atsumi et al. ......... | 365/185.25 |
| 6,240,032 B1 * | 5/2001 | Fukumoto ................... | 365/222 |
| 6,266,276 B1 * | 7/2001 | Odani .................... | 365/185.18 |
| 6,522,586 B2 * | 2/2003 | Wong .................... | 365/185.25 |
| 6,570,790 B1 * | 5/2003 | Harari ................... | 365/185.29 |
| 2004/0047205 A1 * | 3/2004 | Hazama et al. ............. | 365/202 |
| 2004/0213035 A1 * | 10/2004 | Cavaleri et al. ............ | 365/154 |

FOREIGN PATENT DOCUMENTS

JP  6-215584  8/1994

OTHER PUBLICATIONS

Y. Kamigaki et al., "MNOS Nonvolatile Semiconductor Memory Technology: Present and Future," IEICE Trans. Electron., vol. E84-C, No. 6, pp. 713-723, (Jun. 2001).

* cited by examiner

*Primary Examiner*—Ly Duy Pham
(74) *Attorney, Agent, or Firm*—Miles & Stockbridge PC

(57) ABSTRACT

Disclosed here is a nonvolatile semiconductor memory device used to prevent data loss that might occur in unselected memory cells due to a disturbance that might occur during programming/erasing in/from those memory cells. In the nonvolatile semiconductor memory device, the number of programming/erasing operations performed in a data storage block over a programming/erasing unit of the subject nonvolatile memory is recorded in an erasing/programming counter EW CT provided in each data storage block. When the value of the erasing/programming counter reaches a predetermined value, the data storage block corresponding to the erasing/programming counter is refreshed. In the refreshing operation, the data in the data storage block is stored in a temporary storing region provided in the data storage block, then the data in a temporary storing region of the data storage area is erased and the data stored temporarily is programmed in the data storage block again.

8 Claims, 13 Drawing Sheets

PRIOR ART
FIG. 3

|  |  |  | SELECTED WELL | | | UNSELECTED WELL | | |
|---|---|---|---|---|---|---|---|---|
|  |  |  | SL | BL | WELL | SL | BL | WELL |
| ERASE | SELECTED SG · MG | SG 1.5V | 1.5V | 1.5V | 1.5V | 1.5V | OPEN | -13V |
|  |  | MG -13V |  |  |  |  |  |  |
|  | UNSELECTED SG · MG | SG 0V |  |  |  |  |  |  |
|  |  | MG 1.5V |  |  |  |  |  |  |
| PROGRAM | SELECTED SG · MG | SG 1.5V | -13V /1.5V * | -13V /1.5V * | -13V | 1.5V | OPEN | -13V |
|  |  | MG 1.5V |  |  |  |  |  |  |
|  | UNSELECTED SG · MG | SG 0V |  |  |  |  |  |  |
|  |  | MG -13V |  |  |  |  |  |  |

* -13V FOR PROGRAMMED CELLS, AND 1.5V FOR UNPROGRAMMED CELLS

FIG. 12
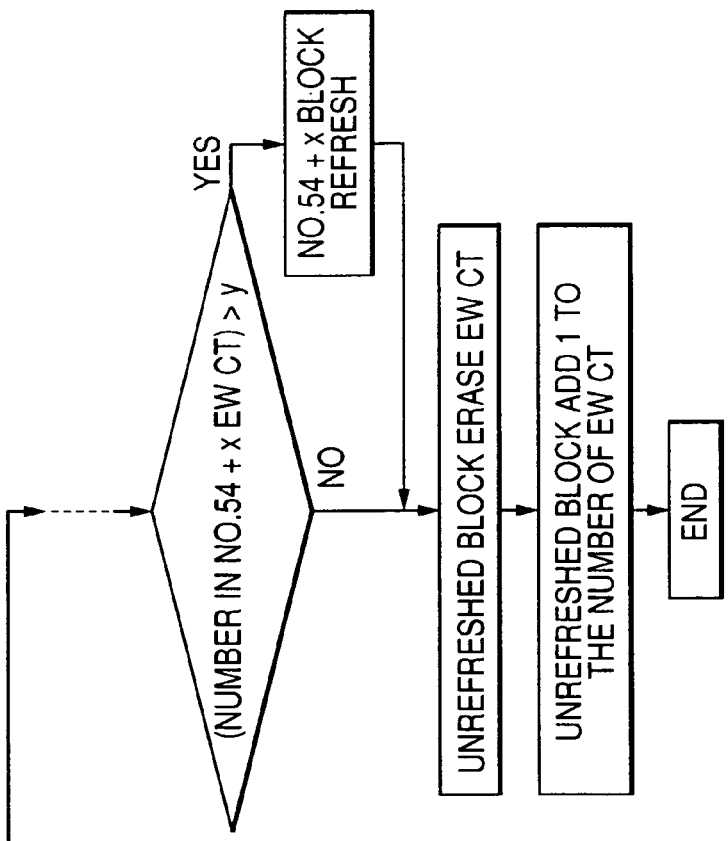
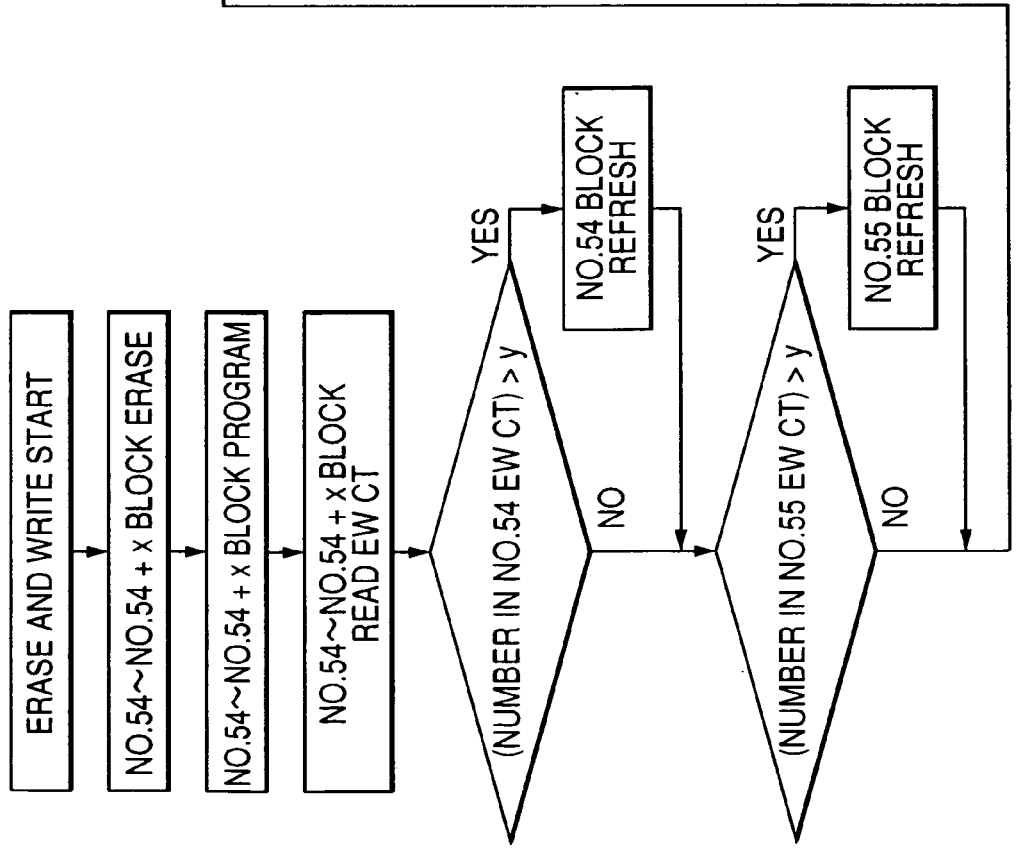

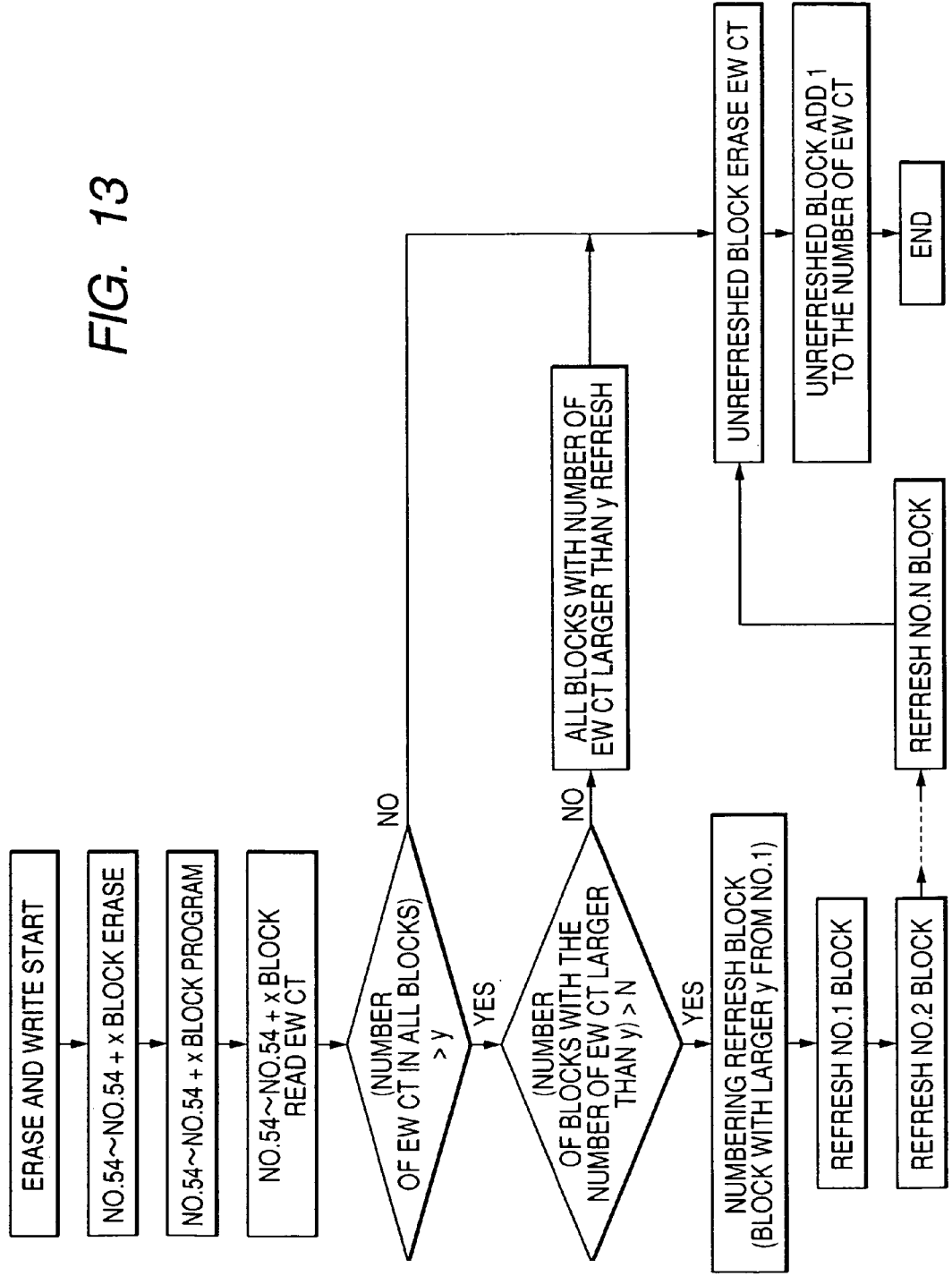

NONVOLATILE SEMICONDUCTOR MEMORY DEVICE

CLAIM OF PRIORITY

The present application claims priority from Japanese application JP 2003-422119 filed on Dec. 19, 2003, the content of which is hereby incorporated by reference into this application.

FIELD OF THE INVENTION

The present invention relates to a nonvolatile semiconductor memory device and more particularly to a technique for realizing a finer effective cell area and preventing data loss caused by a disturbance during programming/erasing in a byte reprogramming type EEPROM capable of fast programming/erasing and excellent in data holding characteristics.

BACKGROUND OF THE INVENTION

As electrically programmable nonvolatile semiconductor memory devices, the EEPROM (Electrically Erasable and Programmable Read Only Memory) is widely used for storing programs or data. Particularly, in recent years, such EEPROMs used as data storage devices have come to meet a great demand, for example, they are used in IC cards. Generally, as such data storage EEPROMs, not flash EEPROMs, in which several kilobytes to several tens of kilobytes of information are erased simultaneously, but byte-programmable EEPROMs that can erase/program information in bytes are used. The number of erase/program cycles required in data storage devices is usually over 100,000 times, which is more than that in program storage devices. If an EEPROM is mounted together with a microcomputer on the same chip, it can prevent data reading from external.

However, the byte programmable EEPROM used for storing data is often confronted with a problem of disturbance which occurs in unselected memory cells during programming/erasing operation. The disturbance mentioned here means a phenomenon that a voltage to be applied to a selected memory cell also comes to be applied to unselected memory cells connected to the same line, thereby information is programmed/erased weakly in/from the unselected memory cells and data is lost gradually therefrom. In a flash EEPROM, when erasing is performed simultaneously on a block of memory cells which are connected to the same line as that of a line to which a high voltage is applied to program/erase, a disturbance occurring during erasing does not become a problem at all and memory cells receive a disturbance only during one-time programming. On the other hand, in the byte programming type EEPROM in the worst case, no programming/erasing is done in/from some memory cells while all other bytes in the same block are programmed/erased 100,000 times. Each of those memory cells will receive disturbances as many as 100,000 times x (the number of bytes in the block—1). The byte programming type EEPROM comes to have disturbance conditions far more strict than those of the flash EEPROM.

The non-patent document 1 discloses a technique for realizing programming/erasing cycles of 100,000 times in the byte programming type EEPROM. FIG. 1 shows a cross sectional view of memory cells of such an EEPROM. FIG. 2 shows a circuit diagram of a memory cell array. As shown in FIG. 1, one memory cell consists of an MNOS type memory for storing information by accumulating a charge in a silicon nitride film SIN and a select transistor for selecting the cell for reading. In the memory cell array, as shown in FIG. 2, select gate lines (word lines) SG0 to SGn for connecting select gate electrodes SG and memory gate lines MG0 to MGn for connecting memory gates MG are extended in parallel to each other while bit lines BL0 to BL7 for connecting drain regions D and source lines SL to SL7 for connecting source regions S of memory cells respectively are extended in a direction orthogonal to the word lines. And, wells WELL1 to WELLn of memory cells are divided to correspond to memory cells connected to word lines and grouped in 8 bits. Information is programmed/erased in units of 8 bits connected to a common memory gate line and a well, that is, in byte units. FIG. 3 shows voltage conditions for erasing/programming a block of selected memory cells shown in FIG. 2. In those selected memory cells in/from which information is to be erased/programmed, a high voltage is applied between a memory gate MG and a well WELL to erase information from an object memory cell by means of tunneling of holes through a bottom oxide film BOTOX and program information in the memory cell by means of tunneling of electrons. In an unselected memory cell, the same voltage as that applied to the memory gate MG is applied to the well WELL or source line SL so as not to apply an electric field in the gate insulation film of the NMOS memory. In other words, according to the above known technique, a well WELL is divided into single-byte regions so that no electric field is applied to the gate insulation film of the MNOS memory of any unselected memory cell during programming/erasing, thereby data is held in the memory cell even when reprogramming is done more than 100,000 times under no influence of a disturbance.

In the above byte programming type EEPROM, in each memory cell connected to a selected memory gate line MG and an unselected well WELL, the same voltage is applied to both of the memory gate MG and the well WELL. At that time, however, a high electric field is applied to between the memory gate MG and the source S, thereby electrons and holes will be injected into an adjacent silicon nitride film SIN of the source shown in FIG. 1. If the length of the memory gate Lmg is large, the charge in the silicon nitride film SIN is held in the center of the channel of the MNOS memory away from the source S, so that the charge injection around the source S arises no problem. However, if the length of the memory gate Lmg is small, the charge injection around the source comes to lose the resistance to the disturbance during programming/erasing, thereby the programming/erasing cycles of 100,000 times cannot be assured any more. In other words, the above conventional technique is just effective for the byte programming type EEPROM limited in the shrinkage in memory cell size.

Furthermore, according to the above conventional technique, because programming/erasing is made by means of tunneling of electrons/holes, the technique is confronted with the following problems. (1) It takes much time to write/erase information. (2) The bottom oxide film BOTOX cannot be formed thicker, so that it is difficult to hold data at high temperatures over 100° C.

The patent document 1 discloses a nonvolatile memory in/from which information is programmed/erased by means of hot carrier injection, not by means of tunneling of electrons/holes as described above. FIG. 4 shows a cross sectional view of a memory cell of this memory. The memory is a split gate type MONOS memory having two gates (a select gate SG and a memory gate MG). In the memory, the memory gate insulation film consists of a top oxide film TOPOX, a silicon nitride film SIN, and a bottom oxide film BOTOX. Hot electrons are injected into the silicon nitride film SIN with a source-side injection method to program information while hot holes generated by BTBT (Band-To-Band Tunneling) are injected into the same film to erase information. This hot carrier injection can speedup both programming and erasing, as well as improve the data holding reliability compared to the tunneling injection.

In the case of the programming/erasing method by means of hot carrier injection described above, however, a high voltage is required to be applied to both source region S and memory gate MG, so that how to secure the resistance to disturbance during programming/erasing arises as a problem. And, in order to avoid applying of a high voltage to unselected memory cells during programming/erasing so as not to cause a disturbance in those memory cells, it is required to divide the memory gate line connected to the memory gate MG and the source line connected to the source region S into some single-byte portions. To realize such dividing, a high dielectric MOS transistor is required to select a memory gate line and a source line for each byte respectively. The area per memory cell including that of the MOS transistors thus becomes a double compared to that required when the both lines are not divided.

[Patent document 1] U.S. Pat. No. 5,969,383

[Patent document 2] Official gazette of JP-A No. 215584/1994 (corresponding U.S. Pat. No. 6,160,738)

[Non-patent document 1] IEICE TRANSACTION ON ELECTRONICS, 2001, Vol. E84-C, pp. 713-723

SUMMARY OF THE INVENTION

As described above, when in programming/erasing by means of hot electrons injection or hot holes injection, the nonvolatile semiconductor memory enables fast programming/erasing. In that connection, the top and bottom oxide films of the charge accumulating part are thick and excellent in data holding characteristics. However, because a high voltage is applied to both gate electrode and source region during programming/erasing, unselected memory cells are disturbed. This disturbance becomes a serious problem in the byte programming type EEPROM for realizing programming/erasing cycles of 100,000 times.

The patent document 2 discloses a method for solving a disturbance problem to occur in a nonvolatile semiconductor memory as described above. The method is refreshing the object memory cell from which data is lost due to a disturbance by programming the lost data again in the memory cell. According to this method, memory cell blocks from which data is erased collectively are defined as refreshing blocks and a flag cell is provided for each of such refreshing blocks. When data is to be erased from those refreshing blocks collectively, the first refreshed block among the refreshing blocks is selected according to the information set in the flag cell, then additional programming is done in the block to refresh the block again. This refreshing operation requires electrons injection again at a predetermined count of programming/erasing cycles, so that each cell from which data is erased weakly by a disturbance is restored to its original state, thereby preventing data loss to be caused by disturbance.

When employing the above method for the byte programming type EEPROM, only one byte is erased at a time. Thus, a flag cell is required to be provided for each byte. The area of the EEPROM thus increases. For example, if a flag cell is provided for each single-byte erasing block, the total number of memory cells comes to increase by more than 10%.

Under such circumstances, it is an object of the present invention to provide a nonvolatile semiconductor memory device (byte reprogramming type EEPROM) capable of fast programming/erasing and excellent in data holding characteristics so as to realize a microminiatured effective cell area and prevent data loss to be caused by a disturbance to occur during programming/erasing.

The typical those of the aspects to be disclosed in this specification will be described briefly as follows.

The nonvolatile semiconductor memory device of the present invention includes an erasure block consisting of a plurality of single-byte nonvolatile memory cells to be erased simultaneously, a refreshing block consisting of a plurality of erasure blocks, and the same number of counter areas as that of the refreshing blocks, each counter area being used for storing the number of program/erase operations performed in the refreshing block. The data in a refreshing block is stored once in a temporary storing memory each time the number of program/erase operations stored in the counter area reaches a predetermined count, then the data in the refreshing block is erased completely. After that, the temporarily stored data is programmed in the refreshing block again to reset the disturbance time.

According to the present invention, therefore, the nonvolatile semiconductor memory device enables fast programming/erasing especially by means of hot carriers injection. The nonvolatile semiconductor memory device nonvolatile semiconductor memory device can also reprogram/erase information in byte units to realize a microminiatured effective cell area and prevent data loss to be caused by a disturbance during programming/erasing.

BRIEF DESCRIPTION OF THE DRAWINGS

FIG. 3 is a table for denoting operation voltages of the byte programming type EEPROM;

FIG. 12 is a flowchart of a sequence of programming/erasing/refreshing operations with respect to a plurality of blocks in the embodiment of the present invention; and FIG. 13 is a flowchart of the second sequence of programming/erasing/refreshing operations with respect to a plurality of blocks in the embodiment of the present invention.

DETAILED DESCRIPTION OF THE PREFERRED EMBODIMENTS

Hereunder, the basic configuration of the nonvolatile semiconductor memory device of the present invention will be described.

Figure 1:
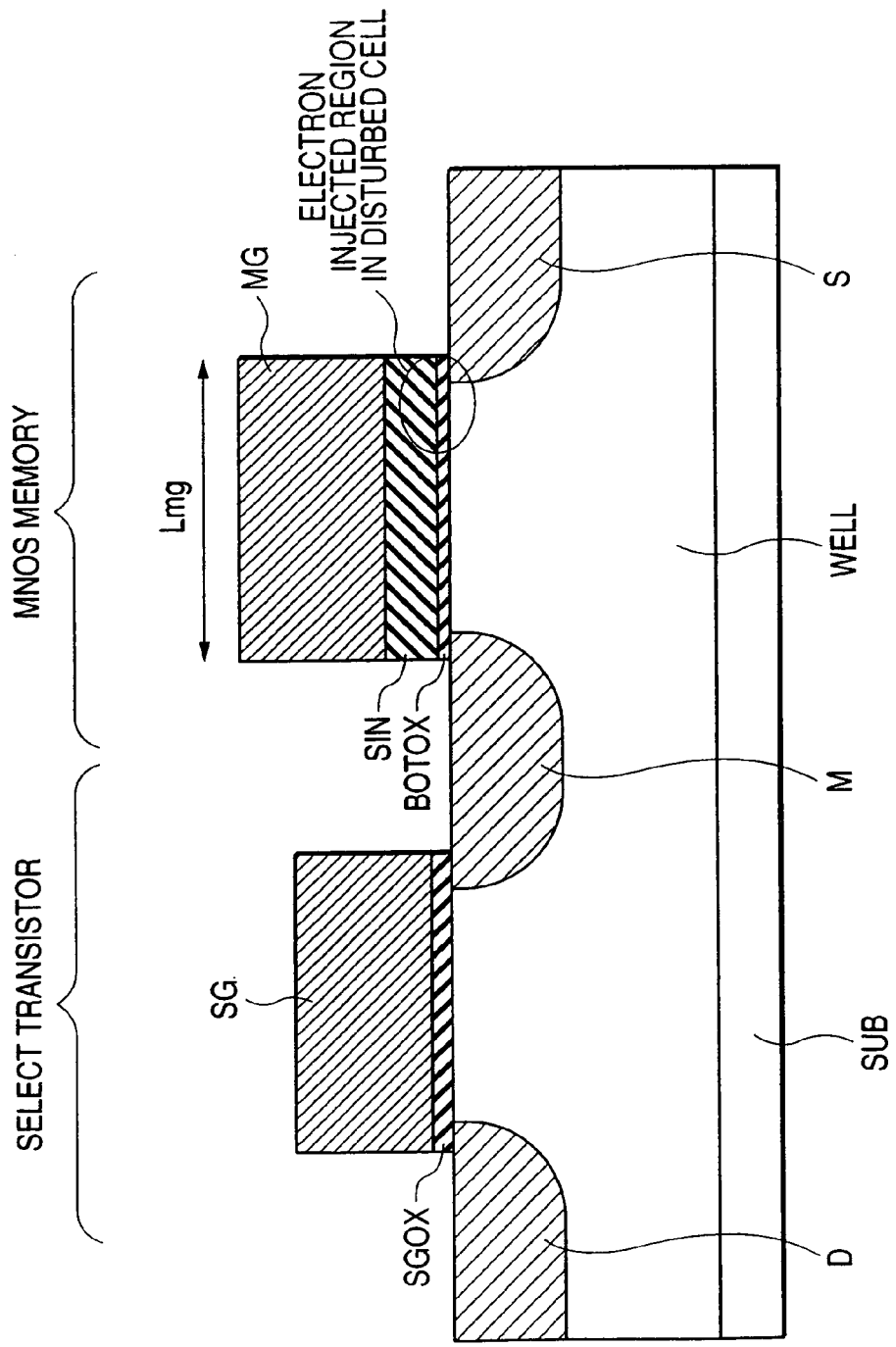
FIG. 1 is a cross sectional view of a byte programming type EEPROM memory cell of a conventional technique.
Figure 2:
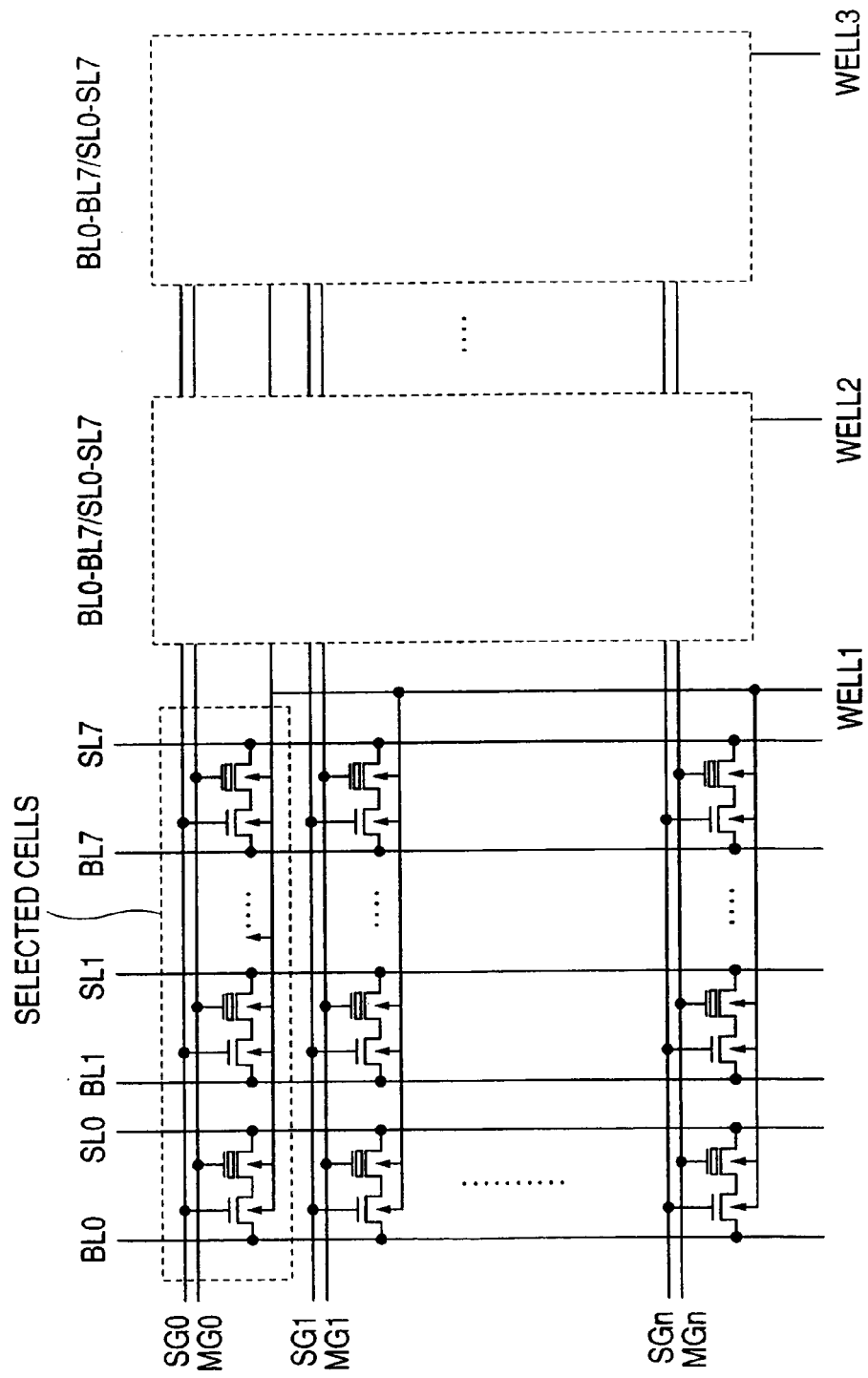
FIG. 2 is a circuit diagram of a byte programming type EEPROM memory cell array of the conventional technique.
Figure 4:
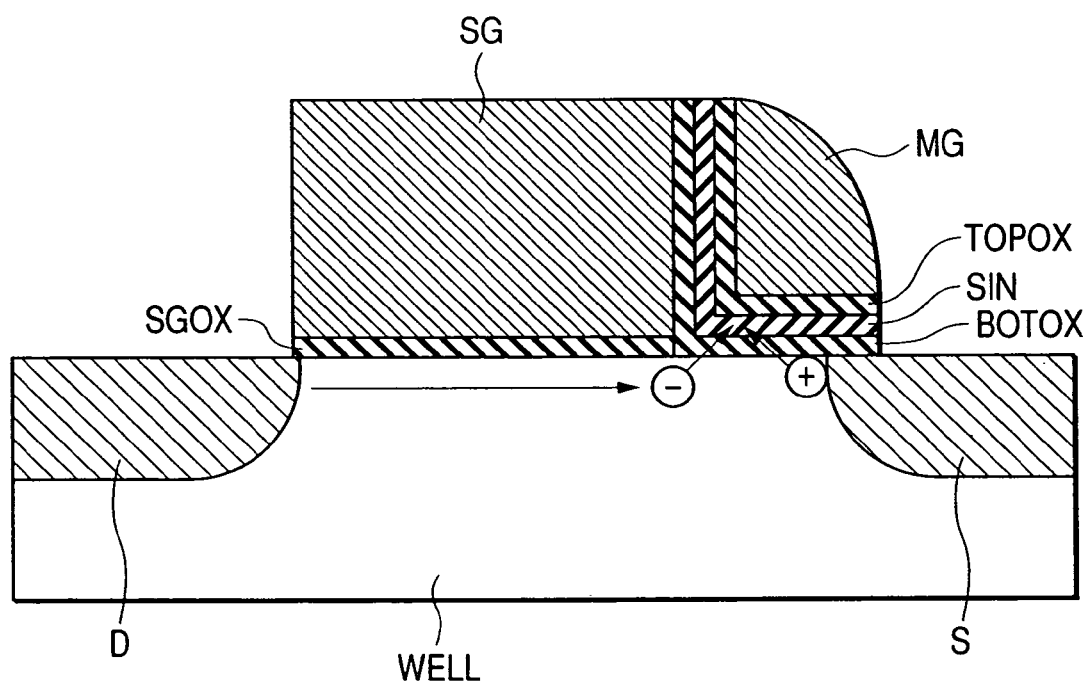
FIG. 4 is a cross sectional view of a nonvolatile semiconductor memory cell in an embodiment of the present invention.
Figure 5:
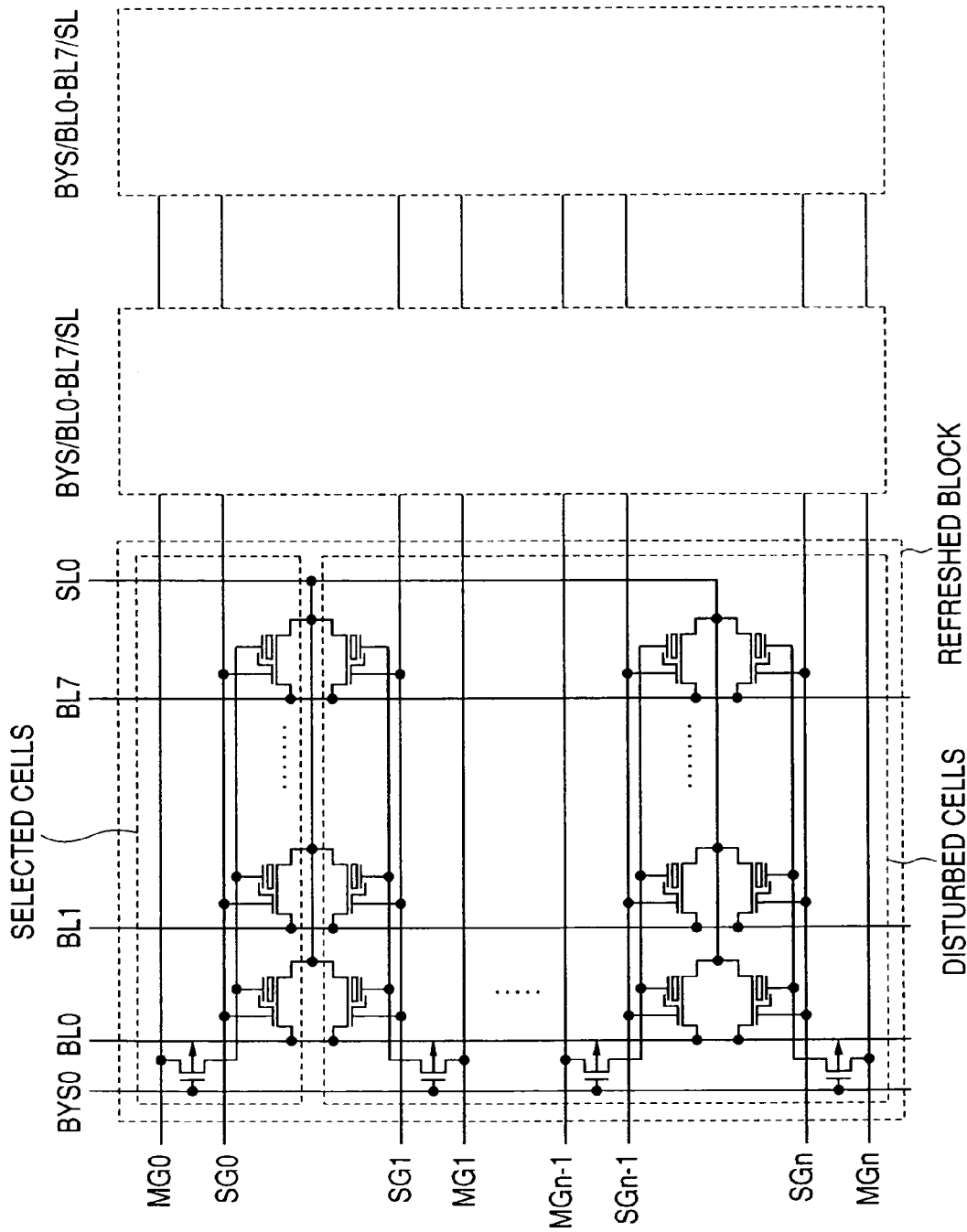
FIG. 5 is a circuit diagram of the nonvolatile semiconductor memory cell array in the embodiment of the present invention.

FIG. 5 shows a circuit diagram of a nonvolatile semiconductor memory array in an embodiment of the present invention. The memory array is a split gate type MONOS memory in which hot carriers are injected into object nonvolatile memory cells to program/erase information therein/therefrom. In the nonvolatile semiconductor memory device, select gate lines (word lines) SG0 to SGn for connecting select gate electrodes SG and memory gate lines MGL for selecting memory gates MG, and source lines SL for connecting each source region shared by two adjacent memory cells are extended in parallel to each another while bit lines BL0 to BL7 for connecting memory cell drain regions are extended in a direction orthogonal to the select gate lines SG0 to SGn. Both of the memory gate lines MGL and the source lines SL are divided into 8-bit portions and a plurality of source lines in the bit line direction are connected to each another to form each common source line SL. Programming/erasing is done for each 8-bit portion, that is, each byte portion connected to the common bit line separately.

Figure 6:
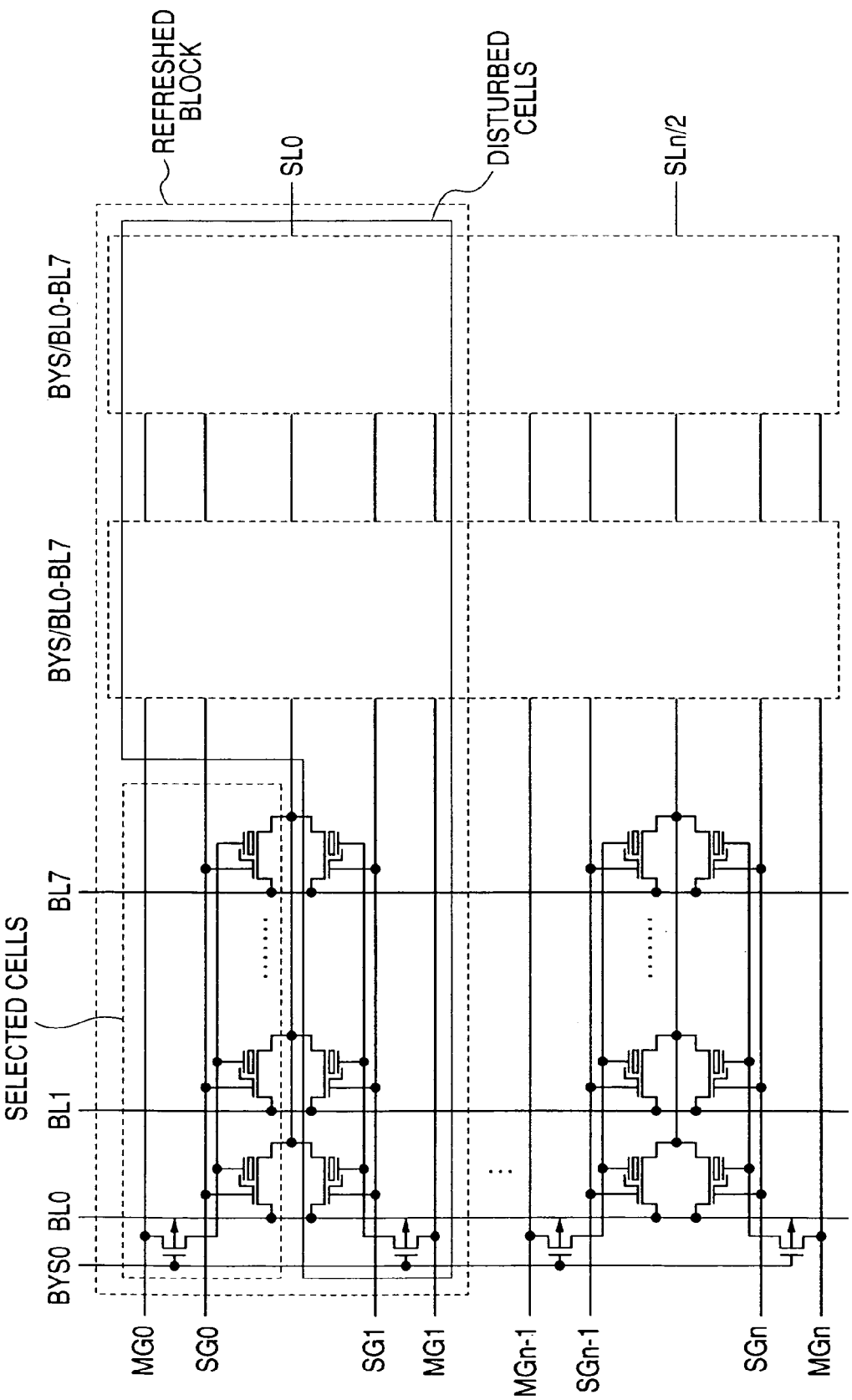
FIG. 6 is another circuit diagram of the nonvolatile semiconductor memory cell array in the embodiment of the present invention.

In the memory cell array shown in FIG. 5, memory cells for a plurality of bytes in the bit line direction are grouped to share a common source line. Just like the memory cell array shown in FIG. 6, memory cells for a plurality of bytes in the select gate line direction can also be grouped to share a common source line. In this case, unselected memory cells connected to a common source line will receive a disturbance during programming/erasing. In FIGS. 5 and 6, the memory gate lines that receive a high voltage when in programming/erasing are divided in units of one byte so that a common source line is shared by a plurality of bytes. Each source line can also be divided in units of one byte so that a memory gate line is shared by a plurality of bytes. On the other hand, in the memory cell array shown in FIG. 7, a source line is shared by a plurality of bytes. It is also possible that a source line is shared by a plurality of memory cells in the bit line direction while a memory gate line is shared by a plurality of memory cells in the select gate line direction. In that connection, although the memory cell array area is reduced more than that shown in FIG. 5, many memory cells will receive a disturbance, since a voltage is applied to both of unselected memory cells that share a source line and unselected memory cells that share a memory gate line during programming/erasing. Unlike the case shown in FIG. 7, a memory gate line may be shared by a plurality of memory cells in the bit line direction and a source line may be shared by a plurality of memory cells in the select gate line direction.

Figure 7:
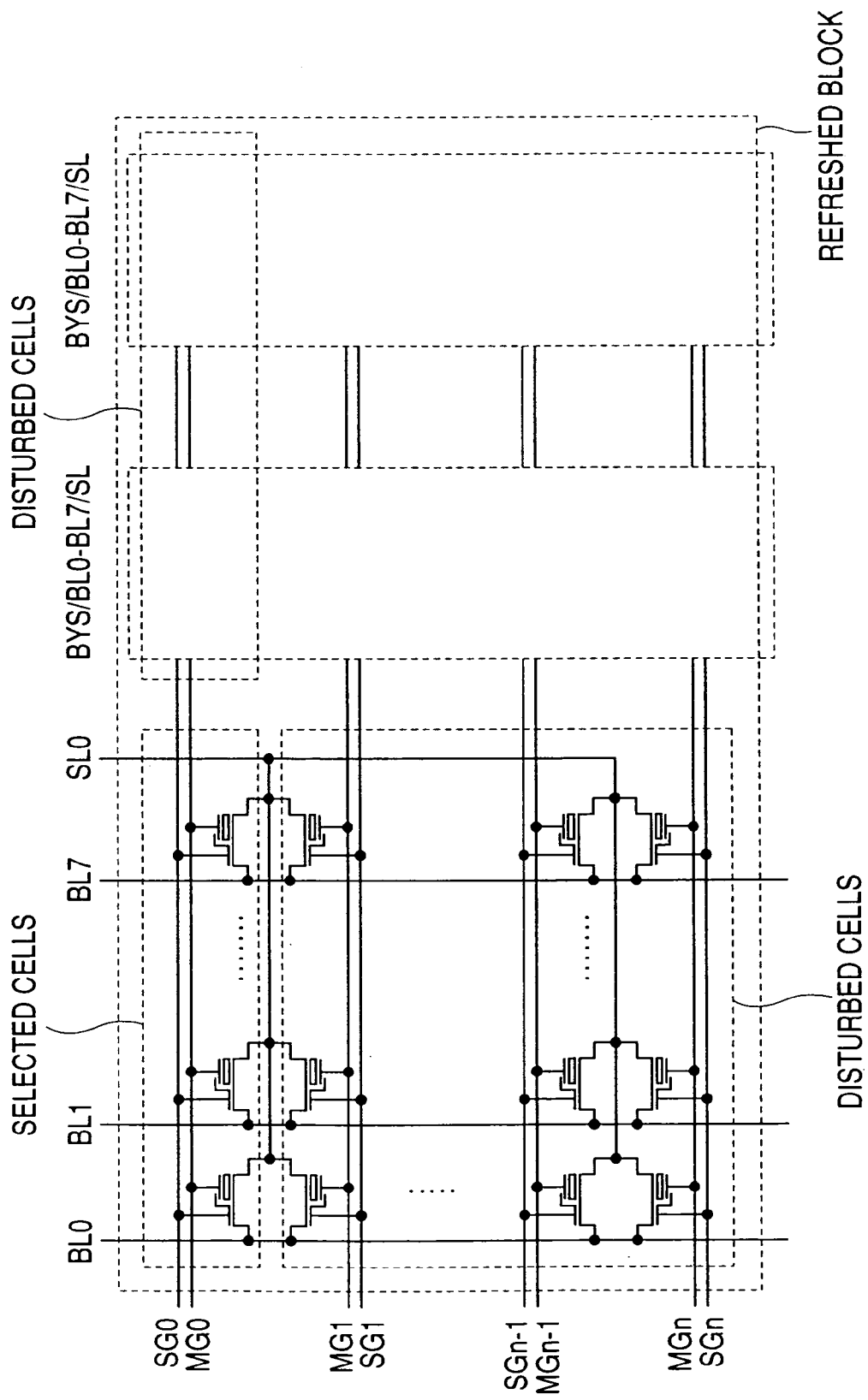
FIG. 7 is still another circuit diagram of the nonvolatile semiconductor memory cell array in the embodiment of the present invention.
Figure 8:
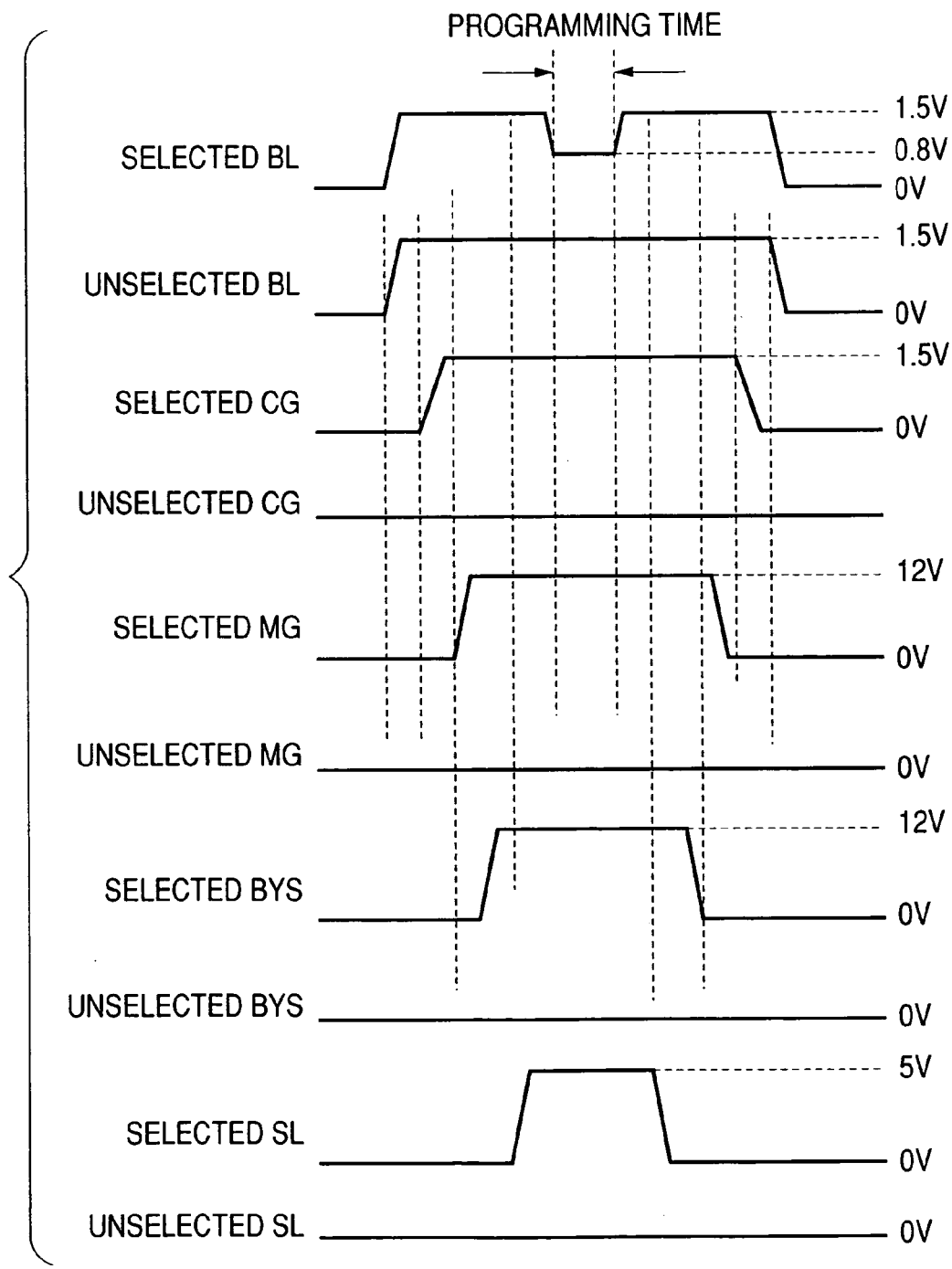
FIG. 8 is a chart of the waveforms of the voltages applied to the lines of the memory cell array shown in FIGS. 5 through 7 during programming.
Figure 9:
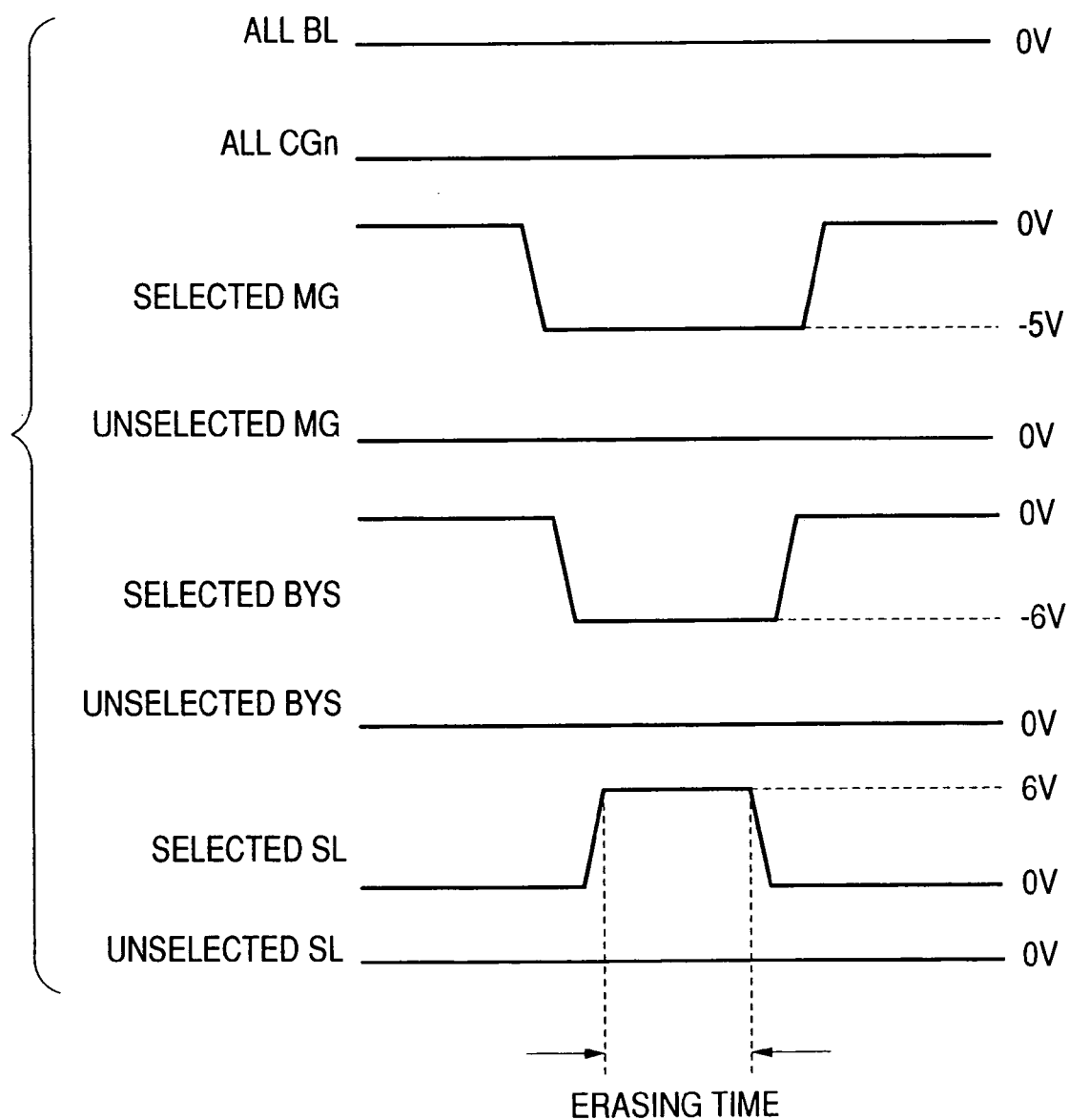
FIG. 9 is a chart of the waveforms of the voltages applied to the lines of the memory cell array shown in FIGS. 5 through 7 during erasing.

FIGS. 8 and 9 show voltage applying sequences during programming and erasing information, respectively, in a selected cell shown in FIGS. 5 through 7. In the memory cell array shown in FIGS. 5 through 7, information is programmed/erased in the same voltage applying sequence. In the cell selected for programming/erasing, a high voltage is applied to both of the memory gate line MG and the source line SL. On the other hand, in each unselected memory cell described as a disturbed cell in FIGS. 5 through 7, a high voltage is applied to either the memory gate line or source line and the cell comes to be disturbed during programming/erasing. In other words, memory cells connected to a common source line will be included in a block to be disturbed.

Figure 10:
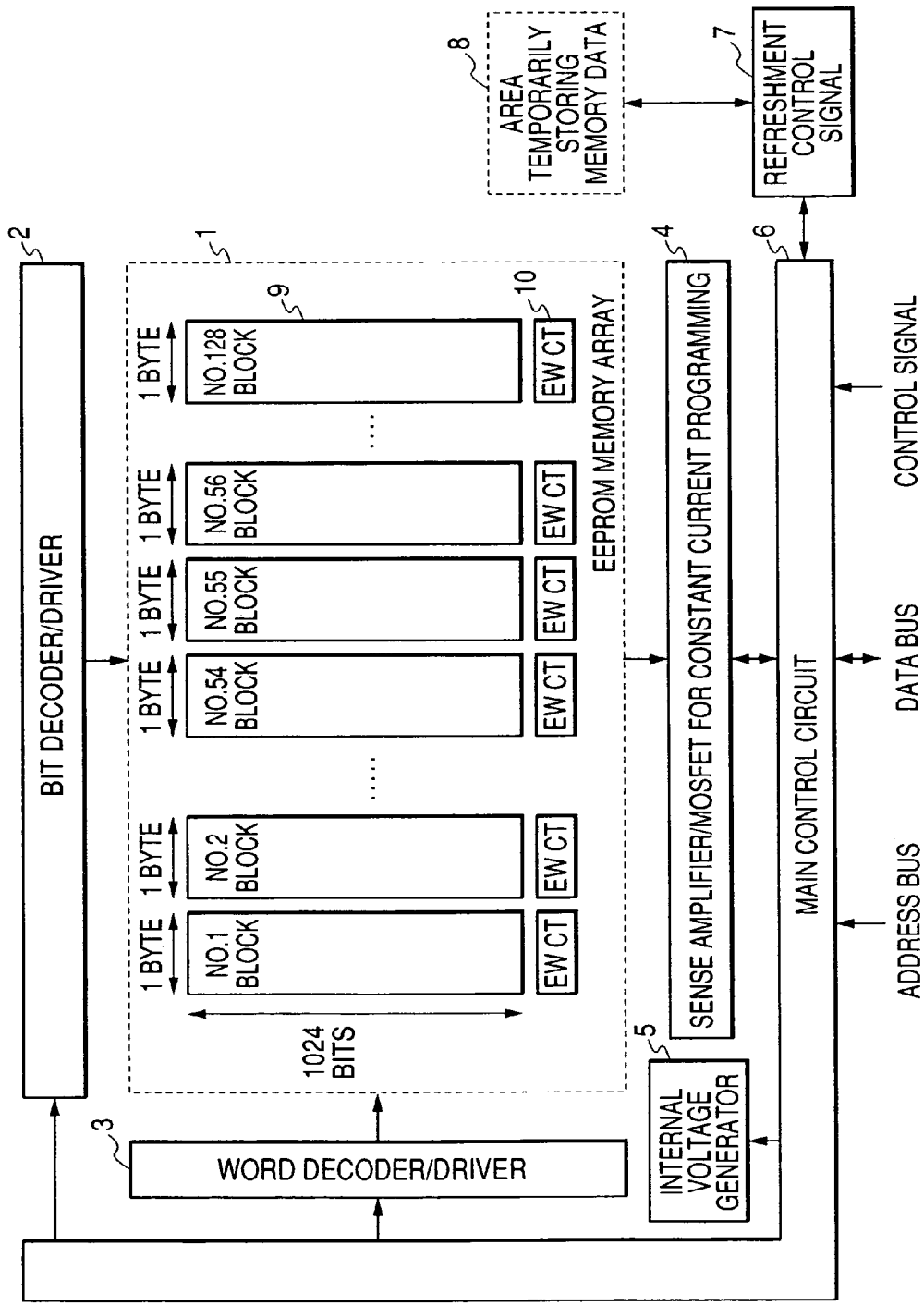
FIG. 10 is a block diagram of the nonvolatile semiconductor memory device in the embodiment of the present invention.

FIG. 10 shows a block diagram of a byte programming type EEPROM module in an embodiment of the present invention. In addition to a memory array 1, a bit line decoder driver 2, a word line driver 3, a sense amplifier/write constant current MOS 4, a power supply circuit 5, and a main controller 6 provided for the conventional EEPROM module described above, this EEPROM module further includes a refreshing control circuit 7 and a data temporary storing area 8. The EEPROM memory array consists of a data storage block 9 and an erasing/programming counter area EWCT 10. The data storage block is used as a unit of refreshing and corresponds to a refreshing block shown in FIGS. 5 through 7. Here, the EEPROM module includes 128 data storage blocks, each consisting of 1 byte×1024 bits. Memory cells in each data storage block 9 are connected to a common source line or memory gate line so that program/erase operations are performed in units of one byte. The number of erasing/programming counter areas EW CT10 is the same as the number of data storage blocks. Each erasing/programming counter area EW CT stores the number of times of program/erase cycles performed in the corresponding data storage area. And, the memory cells in the data storage block should not be connected to those in the erasing/programming counter area EW CT through a common source line and a common memory gate line so as to avoid a disturbance that causes erasing and programming to affect each other in both of the data storage block and the erasing/programming counter area EW CT.

Figure 11:
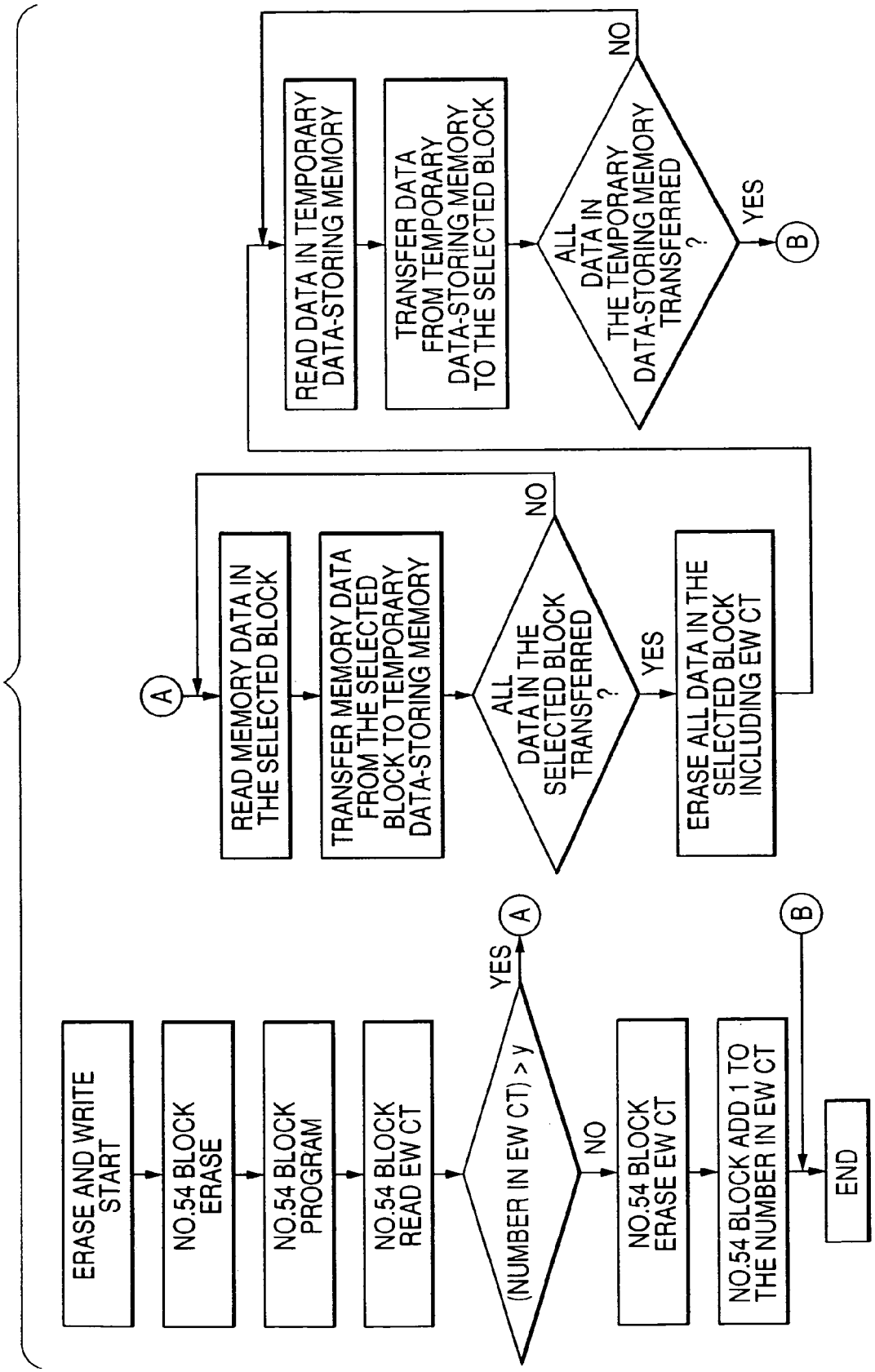
FIG. 11 is a flowchart of the first sequence of programming/erasing/refreshing operations with respect to one block in the embodiment of the present invention.

FIG. 11 shows a flowchart of erasing, programming, and a refreshing operation for resetting disturbance times according to the present invention. In this example, one byte of information in the No. 54 block shown in FIG. 10 is assumed to be erased/programmed.

In this example, at first, the host system or CPU erases/programs one byte of information from/in the No. 54 block. After that, the host system/CPU reads the erasing/programming counter area EW CT corresponding to the No. 54 block to compare the read value with a predetermined value y. If the read value is under y, the system/CPU erases the EW CT once, then programs a value obtained by adding 1 to the read value before erasing the EW CT in the EW CT. This completes both erasing and programming operations.

If the read value is over y, the host system/CPU refreshes the EW CT as follows. At first, the host system/CPU reads the data from the No. 54 block completely, then programs the read data in the temporary storing memory 10 having a capacity equal to or over that of the data storage block 9. The temporary data storing memory 10 may be any of such a non-volatile memory as SRAM, DRAM, or the like and an EEPROM nonvolatile memory. If a nonvolatile memory is used as the temporary data storing memory, data in the temporary memory is required to be erased before the data in the object block is programmed therein.

After programming the data in the No. 54 block in the temporary data storing memory completely, the host system/CPU erases the data from the No. 54 block and the data from the EW CT corresponding to the No. 54 block completely. The host system/CPU then programs the data stored in the temporary data storing memory in the No. 54 block. This completes the refreshing operation and both erasing and programming operations performed with respect to the refreshing operation are also ended.

The above y value is determined by the memory cell disturbance tolerance. For example, in the case of a memory cell having a disturbance tolerance against 100,000 times of erasing/programming, 100,000 times is set for the y value. If it is to assure 100,000 times of programming/erasing cycles without performing this refreshing operation in a configuration of the EEPROM memory array block shown in FIG. 10, the disturbance tolerance is required to stand erasing/programming of 100,000 times x 1023 bytes≈100,000,000 times in the worst case. In other words, the refreshing operation of the present invention can reset a time of receiving weak erasing or programming caused by a disturbance at each predetermined reprogramming count, thereby preventing a data loss to be caused by the disturbance significantly.

In FIG. 11, a description is made for a sequence of erasing/programming/refreshing of just one byte in a block at one programming/erasing operation. Actually, however, erasing/programming may be made for memory cells corresponding to a plurality of bytes existing over a plurality of blocks. FIGS. 12 and 13 show an operation sequence for erasing/programming a plurality of bytes of information from/in a plurality of blocks such way.

FIG. 12 shows a flowchart of an operation sequence for erasing/programming a plurality of bytes of information at a time, then refreshing the object memory cells without limiting the programming/erasing time. In this example, it is assumed that one byte of information is erased/programmed from/in x blocks between No. 54 and No. 54+x at a time.

At first, the host system/CPU erases/programs one byte of information from/in the x blocks from No. 54 to No. 54+x, then reads the EW CT corresponding to each of the blocks. After that, the host system/CPU compares each of the read values with a predetermined value y with respect to the blocks from No. 54 to No. 54+x sequentially and performs a refreshing operation in the same procedure as that shown in FIG. 11. After completing all the refreshing operations, the host system/CPU programs a value obtained by adding +1 to the read value in the corresponding EW CT with respect to each block that is not refreshed yet.

FIG. 13 shows a flowchart of an operation sequence for erasing/programming a plurality of bytes of information at a time within a limited programming/erasing time. If a programming/erasing time is limited such way, all the object blocks cannot be always refreshed. In this example, it is assumed that one byte of information is erased/programmed from/in x blocks from No. 54 to No. 54+x while the number of refreshing operations permitted in one programming/erasing operation is limited to N times. The N value should be predetermined according to the required refreshing time.

Similarly to FIG. 12, at first the host system/CPU erases/programs one byte of information from/in the x blocks from No. 54 to No. 54+x, then reads the EW CT corresponding to each of the blocks. If the read values are all under the predetermined y value, the host system/COU performs no refreshing operation with respect to any block. If the number of blocks having a read value over the y value is under N, the host system/CPU performs a refreshing operation shown in FIG. 11 with respect to all the refreshing blocks. If the number of blocks having a read value over the y value is over N, the host system/CPU numbers the blocks beginning at 1 in an ascending order, then refreshes the blocks sequentially according to their numbers from 1 to N. Finally, the host system/CPU writes a value obtained by adding +1 to each value read from the corresponding EW CT in the object not-refreshed block, then ends the erasing/programming. This method requires a margin to be secured for a disturbance, since some blocks are not refreshed even when the reprogramming count of a block exceeds the y value.

While a description has been made for the erasing, programming, and refreshing operations of the present invention with reference to the sequences shown in FIGS. 11 through 13, the same operations are also effective even when only erasing or programming is made; the host system/CPU compares the value read from each EW CT with a predetermined y value and if the read value is under y, the host system/CPU adds +1 to the EW CT value and if the read value is over the y value, the host system/CPU performs a refreshing operation. If a disturbance arises as a problem only during erasing or programming, the host system/CPU is required just to count the EW CT and refreshes the object. In the above method, the number of times for programming/erasing cycles is counted as just once. However, each of erasing and programming may be counted as once separately.

In the embodiment described with reference to FIG. 10, one block consisting of 1024 bytes is assumed to be connected to a common source line. This size is determined by a time required for refreshing. In the case of an EEPROM memory that is slow in erasing/programming, the refreshing operation is made within a time permitted for one erasing/programming operation. The number of bytes to be connected to a common source line is thus required to be reduced. If the number of bytes is reduced, however, the area of the EEPROM memory array comes to increase.

Although a description has been made for a nonvolatile memory composed of split gate type MONOS memory cells, the split gate type MONOS memory may be replaced with any of the single gate type nonvolatile memory as described in a known document U.S. Pat. No. 6,011,725 and the nonvolatile memory in which a charge is accumulated in each floating gate; data loss to be caused by a disturbance can be prevented in any of those memories. Furthermore, the effects of the present invention are also effective in non-volatile memories such as FeRAMs, phase change memories, MRAMs, etc.

What is claimed is:

1. A nonvolatile semiconductor memory device that includes a nonvolatile semiconductor memory array comprising nonvolatile memory cells,
    wherein said memory array further includes:
    refreshing blocks, each including a plurality of erasure blocks for erasing a respective plurality of said nonvolatile memory cells collectively; and
    counter areas, wherein the number of counter areas equals the number of refreshing blocks, and wherein each said counter area stores a number of programming/erasing operations performed in a corresponding one of said refreshing blocks; and
    wherein data in each refreshing block is stored in a buffer memory each time the number of programming/erasing operations stored in the corresponding counter area reaches a predetermined value, then the data in said refreshing block is erased completely and the data stored in the buffer memory is programmed back to each said refreshing block;
    wherein if a plurality of said counter areas reach a predetermined count value, data in the corresponding refreshing blocks are then stored sequentially in a temporary storing memory, then the data in each of the corresponding refreshing blocks are erased, and said temporarily stored data are programmed back to the corresponding refreshing blocks.

2. The nonvolatile semiconductor memory device according to claim 1, wherein said memory device is selected from among one of the following:
an EEPROM; a charge trapping type device which stores information by accumulating a charge in a trap formed in a gate insulation film; a floating gate type which stores information by accumulating a charge in the floating gate; an FeRAM which stores a polarizing state of a ferroelectric substance as information; a device that stores both a low resistance state and a high resistance state of a phase change film as information; and an MRAM which stores both low resistance and high resistance states of tunnel magnetic resistance as information.

3. The nonvolatile semiconductor memory device according to claim 1,
wherein erasing or programming of said nonvolatile memory cells is done by injecting hot carriers.

4. The nonvolatile semiconductor memory device according to claim 1,
wherein each erasure blocks comprise a plurality of single-byte nonvolatile memory cells.

5. A nonvolatile semiconductor memory device that includes a nonvolatile semiconductor memory array comprising nonvolatile memory cells,
wherein said memory array further includes:
refreshing blocks, each including a plurality of erasure blocks for erasing a respective plurality of said nonvolatile memory cells collectively; and
counter areas, wherein the number of counter areas equals the number of refreshing blocks, and wherein each said counter area stores a number of programming/erasing operations performed in a corresponding one of said refreshing blocks; and
wherein data in each refreshing block is stored in a buffer memory each time the number of programming/erasing operations stored in the corresponding counter area reaches a predetermined value, then the data in said refreshing block is erased completely and the data stored in the buffer memory is programmed back to said refreshing block;
wherein if there are a plurality of said counter areas storing at least a predetermined number of programming/erasing operations, data in subsets of the corresponding refreshing blocks are stored in temporary storing memory sequentially in a descending order of the number of performed operations, then the data in each subset of the refreshing blocks are erased, and said temporarily stored data are programmed back to said corresponding refreshing blocks.

6. The nonvolatile semiconductor memory device according to claim 5, wherein said memory device is selected from among one of the following:
an EEPROM; a charge trapping type device which stores information by accumulating a charge in a trap formed in a gate insulation film; a floating gate type which stores information by accumulating a charge in the floating gate; an FeRAM which stores a polarizing state of a ferroelectric substance as information; a device that stores both a low resistance state and a high resistance state of a phase change film as information; and an MRAM which stores both low resistance and high resistance states of tunnel magnetic resistance as information.

7. The nonvolatile semiconductor memory device according to claim 5,
wherein erasing or programming of said nonvolatile memory cells is done by injecting hot carriers.

8. The nonvolatile semiconductor memory device according to claim 5,
wherein each erasure block comprises a plurality of single-byte nonvolatile memory cells.

* * * * *